US008725103B2

(12) United States Patent
Koroglu et al.

(10) Patent No.: US 8,725,103 B2
(45) Date of Patent: May 13, 2014

(54) RECEIVER INCLUDING A TRACKING FILTER

(75) Inventors: Mustafa H. Koroglu, Austin, TX (US); Yu Su, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 138 days.

(21) Appl. No.: 13/342,548

(22) Filed: Jan. 3, 2012

(65) Prior Publication Data

US 2013/0171954 A1 Jul. 4, 2013

(51) Int. Cl.
H04B 1/10 (2006.01)
(52) U.S. Cl.
USPC ..... 455/307; 455/341; 455/245.1; 455/195.1; 455/197.1; 455/302
(58) Field of Classification Search
CPC ................................. H04B 1/30; H04B 1/1027
USPC ............... 455/307, 341, 245.1, 197, 302, 195
See application file for complete search history.

(56) References Cited

U.S. PATENT DOCUMENTS

| | | | |
|---|---|---|---|
| 2,080,560 | A | 5/1937 | Case |
| 4,316,108 | A | 2/1982 | Rogers, Jr. |
| 4,361,909 | A | 11/1982 | Theriault |
| 4,364,116 | A | 12/1982 | Nossek |
| 4,368,541 | A | 1/1983 | Evans |
| 4,408,348 | A | 10/1983 | Theriault |
| 4,662,001 | A * | 4/1987 | Cruz et al. ............ 455/340 |
| 5,577,235 | A | 11/1996 | Mitra |
| 5,737,035 | A | 4/1998 | Rotzoll |
| 6,097,273 | A | 8/2000 | Frye |
| 6,177,964 | B1 | 1/2001 | Birleson et al. |
| 6,266,522 | B1 | 7/2001 | Holden |
| 6,377,315 | B1 | 4/2002 | Carr et al. |
| 6,377,788 | B1 | 4/2002 | Elder |
| 6,453,157 | B1 | 9/2002 | Roberts |
| 6,535,722 | B1 | 3/2003 | Rosen |
| 6,549,096 | B2 | 4/2003 | Groves et al. |
| 6,681,102 | B1 | 1/2004 | Collier |
| 6,778,117 | B1 | 8/2004 | Johnson |
| 6,915,114 | B2 | 7/2005 | Khorram |
| 6,917,328 | B2 | 7/2005 | Rabinowitz et al. |

(Continued)

OTHER PUBLICATIONS

Actions on the Merits for Continuation-in-Part U.S. Appl. No. 13/468,824, filed May 10, 2012 and Actions on the Merits for U.S. Appl. No. 13/160,564, filed Jun. 15, 2011 which is copending with 1052-0108.

(Continued)

*Primary Examiner* — Sanh Phu
(74) *Attorney, Agent, or Firm* — Polansky & Associates, P.L.L.C.; Paul J. Polansky (57) ABSTRACT

A receiver includes a low noise amplifier having an input for receiving a radio frequency signal, and an output. The receiver further includes a tracking filter having an input coupled to the output of the low noise amplifier. The tracking filter including a bandpass filter configured to pass the radio frequency signals. The bandpass filter includes a variable capacitor having a first electrode coupled to the input of the tracking filter for receiving the radio frequency signals, and a second electrode coupled to a power supply terminal. The bandpass filter further includes a transformer having a primary winding including a first terminal coupled to the first electrode of the variable capacitor and a second terminal coupled to a second power supply terminal. The transformer further includes a secondary winding.

19 Claims, 4 Drawing Sheets

(56) References Cited

U.S. PATENT DOCUMENTS

| | | |
|---|---|---|
| 7,039,385 B1 | 5/2006 | Hoffman |
| 7,095,454 B2 | 8/2006 | Waight |
| 7,158,774 B2 | 1/2007 | Helio |
| 7,231,192 B2 | 6/2007 | Suzuki |
| 7,305,223 B2 | 12/2007 | Liu et al. |
| 7,327,406 B2 | 2/2008 | Utsunomiya et al. |
| 7,395,548 B2 | 7/2008 | Runzo |
| 7,459,963 B2 * | 12/2008 | Kimura .................. 327/553 |
| 7,577,413 B2 | 8/2009 | He |
| 7,620,379 B2 | 11/2009 | Isaac |
| 7,973,603 B2 | 7/2011 | Kammula |
| 8,103,233 B2 | 1/2012 | Im |
| 2005/0040909 A1 | 2/2005 | Waight |
| 2006/0064725 A1 | 3/2006 | Rabinowitz et al. |
| 2007/0165143 A1 | 7/2007 | Utsunomiya et al. |
| 2008/0198269 A1 | 8/2008 | Gomez |
| 2009/0176467 A1 | 7/2009 | Im |
| 2009/0251618 A1 | 10/2009 | Gao |
| 2010/0130155 A1 | 5/2010 | Khoini-Poorfard |
| 2012/0302188 A1 | 11/2012 | Sahota |
| 2013/0171952 A1 * | 7/2013 | Koroglu et al. ............ 455/245.1 |

OTHER PUBLICATIONS

Actions on the Merits for U.S. Appl. No. 13/160,564, filed Jun. 15, 2011 which is copending with Continuation-in-Part U.S. Appl. No. 13/468,824, filed May 10, 2012.

"Applications of Switched-Capacitor Circuits in Active Filters and Instrumentation Amplifiers," Dr. William R. Grisé, Department of IET, Morehead State University, Technology Interface, vol. 3 No. 3, Fall 1999, ISSN# 1523-9926.

"Novel LC Pseudo Switched Capacitor Filter Suited for Wireless RF Applications," Ahmed El Oualkadi et al., IEICE Electronics Express, vol. 2, No. 8, Apr. 2005, pp. 286-291.

* cited by examiner

RECEIVER INCLUDING A TRACKING FILTER

FIELD

The present disclosure is generally related to receiver circuits, and more particularly to receiver circuits configurable to receive ultra high frequency and very high frequency broadcast radio frequency signals.

BACKGROUND

Receiver circuits are used for both terrestrial and cable reception within televisions, digital video recorders, video cassette records, set-top box devices (such as cable and satellite tuners), frequency modulation (FM) radios, models, and other electronic devices. Some smart phones also utilize receiver circuits for television reception. In general, such receiver circuits include a tuner that selects a narrowband signal from within a wide or broad-band signal having multiple channels. The tuner includes bandpass filters, amplifiers, and mixer circuits for selecting a desired channel and for rejecting unwanted channels, noise and interference.

Television signals can be broadcast at a variety of different frequencies, including ultra-high frequency (WV), very high frequency (VHF), and high frequency (HF) frequency hands. The International Telecommunications Union (ITU) defines the UHF frequency range as encompassing electromagnetic waves between 300 MHz and 3 GHz. VHF occupies frequencies within a range from approximately 30 MHz to 300 MHz, and HF occupies frequencies within a range from approximately 3 MHz to 30 MHz.

For a conventional tracking filter, multiple bandpass filters are included to cover the range of possible frequencies, each tuned to a limited portion of the overall bandwidth of the receiver. For each filter, a large tuned impedance is desirable to minimize the noise figure; however, the tuned impedance is typically a function of the frequency and the size of the inductor, which size can limit the frequency range for the particular filter.

SUMMARY

In an embodiment, a receiver includes a low noise amplifier having, an input for receiving a radio frequency signal, and an output. The receiver further includes a tracking filter coupled to the output of the low noise amplifier. The tracking filter includes a bandpass filter configured to pass the radio frequency signals above a first frequency threshold. The bandpass filter includes a variable capacitor having a first electrode coupled to the output of the low noise amplifier, and a second electrode coupled to a power supply terminal. The bandpass filter further includes a transformer having a primary winding including a first terminal coupled to the first electrode of the variable capacitor and a second terminal coupled to a second power supply terminal. The transformer further includes a secondary winding.

In another embodiment, a receiver includes a low noise amplifier having an input for receiving a radio frequency signal and having an output. The receiver further includes a tracking filter coupled to the output of the low noise amplifier and including a first filter configured to pass the radio frequency signals below a first frequency threshold. The first filter includes a single-to-differential amplifier including an input coupled to the output of the low noise amplifier, and including a first output and a second output. The first filter further includes a tracking bandpass filter coupled between the first and second outputs.

In still another embodiment, a tracking filter for use in a television receiver includes an input terminal for receiving a radio frequency signal and a first filter including an input coupled to the input terminal and configured to pass frequencies below a first threshold. The first filter includes a single-to-differential amplifier having an input coupled to the input terminal, and having a first output and a second output. The first filter further includes a band-pass filter coupled between the first and second outputs. The receiver also includes a second tiller including an input coupled to the input terminal and configured to pass frequencies between the first threshold and a second threshold.

BRIEF DESCRIPTION OF THE DRAWINGS

In the following discussion, reference numerals are reused to indicate the same or similar elements in the various illustrated examples.

DETAILED DESCRIPTION OF ILLUSTRATIVE EMBODIMENTS

Embodiments of a receiver circuit are described below that include a low noise amplifier for receiving a radio frequency signal and including an output coupled to an input of a tracking filter configured to receive very high frequency ($VHF_{LO}$ and $VHF_{HI}$) and UHF broadcast signals. As used herein, $VHF_{LO}$ signals refer to radio frequency signals in a range of approximately 50 to 190 MHz. $VHF_{HI}$ signals refer to radio frequency signals in a range of approximately 190 to 470 MHz, and UHF signals refer to radio frequency signals in a range of approximately 470 to 860 MHz. The $VHF_{LO}$ portion of the tracking filter includes a low pass filter for receiving $VHF_{LO}$ broadcast signals and that utilizes inductive peaking to extend an upper frequency range (or limit) of the low-pass filter. The $VHF_{LO}$ portion of the tracking filter includes a single-to-differential amplifier having an input coupled to the output of the low noise amplifier, and having a first output and a second output. The $VHF_{LO}$ portion of the tracking filter further includes a band-pass filter coupled between the first and second outputs, which band-pass filter can be an inductive-capacitive filter. The UHF portion of the tracking filter uses a transformer in place of a single-to-differential amplifier. The transformer includes a primary winding coupled to the output of the low noise amplifier and a secondary winding magnetically coupled to the primary winding. The secondary winding is configured to include more turns than the primary winding in order to provide a signal gain between the primary and secondary windings. An example of one possible embodiment of a receiver circuit having a filter configured for VHF$_{LO}$, VHF$_{HI}$, and UHF reception is described below with respect to FIG. 1.

Figure 1:
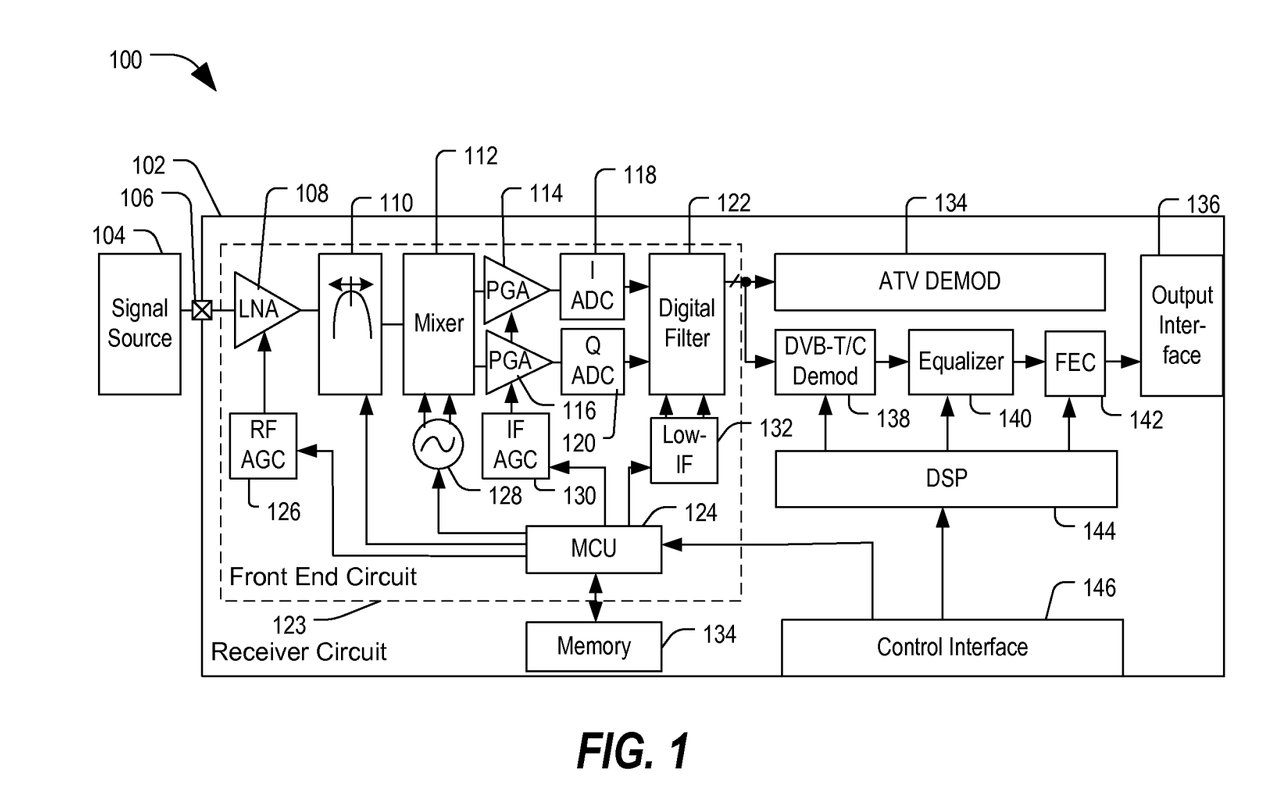
FIG. 1 is a block diagram of an embodiment of a system including a receiver circuit having a tracking filter configurable to receive $VHF_{LO}$, $VHF_{HI}$ and UHF broadcast signals.

FIG. 1 is a block diagram of an embodiment of a system 100 including a receiver circuit 102 having a tracking filter 110 configurable to receive VHF$_{LO}$, VHF$_{HI}$, and UHF broadcast signals. System 100 includes a signal source 104 coupled to receiver circuit 102 through an input terminal or pad 106. Signal source 104 can be an antenna, a coaxial cable, or other signal source for delivering radio frequency broadcast signals to pad 106. Receiver circuit 102 includes a front end circuit 123, which includes a low-noise amplifier (LNA) 108 having an input coupled to pad 106 and an output coupled to an input of a tracking filter 110. Tracking filter 110 includes a control input coupled to microcontroller unit 124 and an output coupled to an input of a mixer 112.

Mixer 112 includes inputs for receiving an oscillator signal from a local oscillator 128. Mixer 112 further includes an output for providing an in-phase signal to a programmable gain amplifier (PGA) 114 and an output for providing a quadrature signal to PGA 116. PGA 114 includes an output coupled to an analog-to-digital converter (ADC) 118, which has an output coupled to an input of a digital filter 122. PGA 116 includes an output coupled to ADC 120, which has an output coupled to an input of digital filter 122.

Front end circuit 123 also includes a radio frequency automatic gain control (AGC) circuit 126 including an input coupled to an output of MCU 124 and an output coupled to an input of LNA 108. MCU 124 is also coupled to local oscillator 128 to control the frequency of the local oscillator signals. Front end circuit 123 further includes an intermediate frequency (IF) AGC circuit 130 including a control input coupled to an output of MCU 124 and outputs coupled to PGAs 114 and 116. Front end circuit 123 also includes a low-IF circuit 132 having a control input coupled to an output of MCU 124 and includes outputs coupled to inputs of digital filter 122. MCU 124 is also coupled to memory 148, which may store instructions and/or data that can be used by MCU 124 to control operation of the front end circuit 123.

Receiver 102 further includes an analog television demodulator 134 having an input coupled to an output of digital filter 122 and an output coupled to an input of an output interface 136. Receiver 102 also includes a digital video broadcast terrestrial/cable (DVB-T/C) demodulator 138 having an input coupled to the output of digital filter 122, an input coupled to an output of digital signal processor (DSP) 144, and an output coupled to an input of equalizer 140. Equalizer 140 includes an input coupled to an output of DSP 144, and an output coupled to an input of a forward error correction (FEC) circuit 142, which has a second input coupled to an output of DSP 144 and an output coupled to an input of output interlace 136. DSP 144 includes a control input coupled to an output or a control interface 146, which may be coupled to a host system for receiving control and other signals. Control interface 146 also includes an output coupled to MCU 124.

Digital filter 122 provides the output signals to tuner circuitry, including analog television demodulator 134 and DVB-T/C demodulator 138, which demodulate the video signal. Analog television demodulator 134 provides the demodulated output to output interface 136, which may be coupled to an audio/video system on a chip or other multimedia circuit. DVB-T/C demodulator 138 provides the output to equalizer 140, which adjusts the relative strength of selected frequencies within the demodulated output signal and provides the adjusted signal to FEC 142. FEC 142 uses forward error correction to correct signal errors and provides the corrected signal to output interface 136.

In this example, tracking filter 110 includes a low-pass filter portion for receiving and filtering VHF$_{LO}$ broadcast signals, a second filter portion for receiving and filtering VHF$_{HI}$ broadcast signals, and a third filter portion for receiving and filtering UHF broadcast signals. In an example, the low-pass filter portion includes a single-to-differential amplifier that includes an inductor/capacitor bandpass filter at the outputs and uses inductive peaking to extend the bandwidth range. The third portion of the filter eliminates the single-to-differential amplifier and replaces it with a transformer having a primary winding with a relatively high quality factor (Q) and a secondary winding with a much lower Q. The transformer can provide approximately a 3 decibel (3 dB) gain. By introducing a gain between the primary and second windings, any impact of limited linearity of the output of LNA 108 on overall system linearity is also reduced.

By adjusting the VHF$_{LO}$ and UHF filter portions, the overall number of inductive-capacitive (LC) filters through the tracking filter 110 can be reduced. In an example, the frequency range over which the receiver 102 operates can be divided into an upper range, a mid-range, and a low range of frequencies, thereby reducing the overall complexity of the tracking filter.

In conventional tracking filters, the input impedance of each filter is often designed to be large to minimize the noise figure. To achieve the high tuned impedance, the size of the inductor is increased, which limits the maximum tuned frequency for each filter. Accordingly, a number of filters are included to provide filtering across the frequency range. A representative example of a receiver including a conventional tracking filter is described below with respect to FIG. 2.

Figure 2:
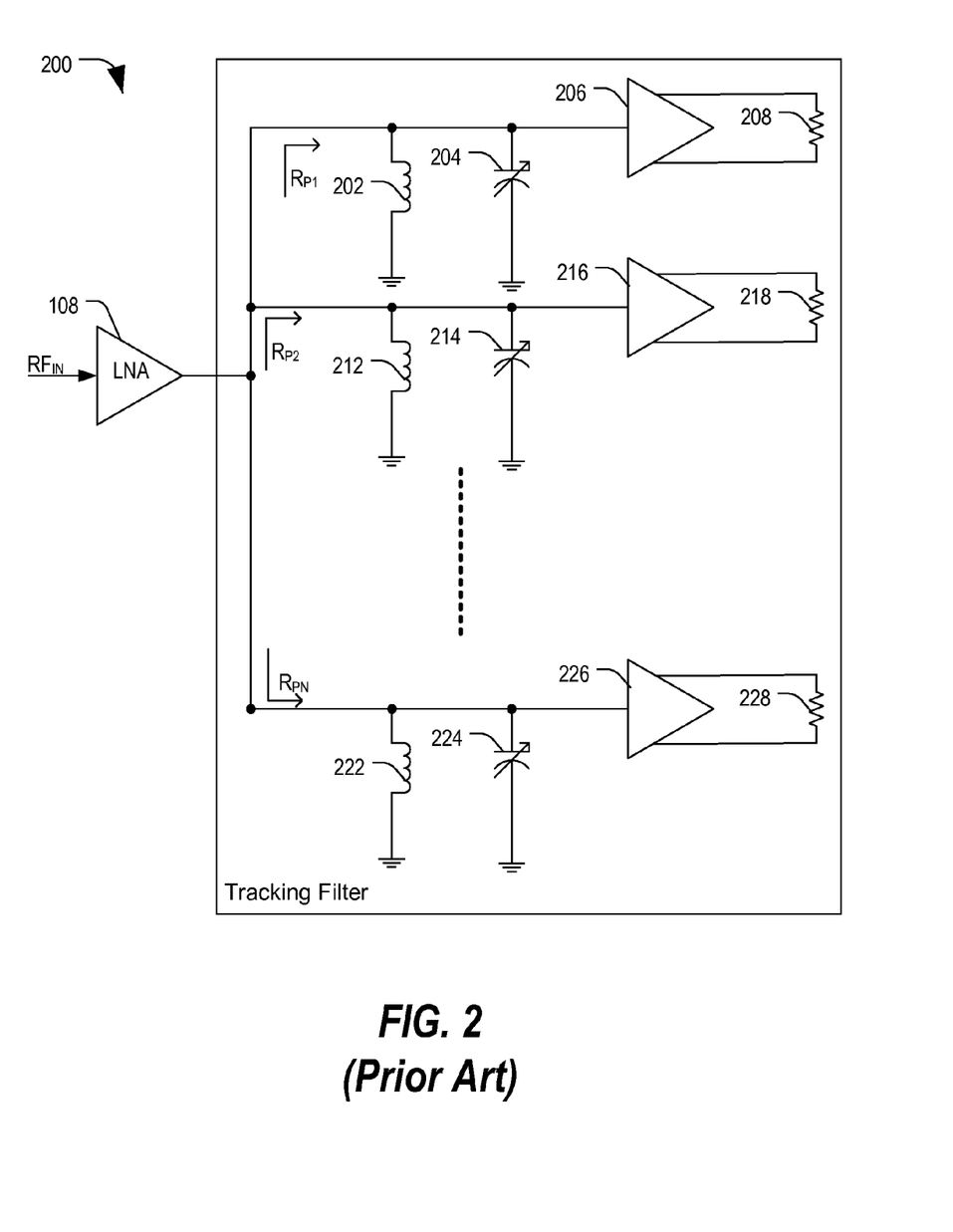
FIG. 2 is a circuit diagram of a representative example of a receiver including conventional tracking filter having a separate bandpass filter tuned for each frequency band.

FIG. 2 is a circuit diagram of a representative example of a receiver 200 including a conventional tracking filter 201 having a separate bandpass filter tuned for each frequency band. Receiver 200 includes LNA 108 having an input for receiving a radio frequency input signal (RF$_{IN}$) and an output coupled to an input of tracking filter 201.

Tracking filter 201 can include any number (N) of signal paths. In the illustrated example includes a first signal path including an inductor 202, a variable capacitor 204, a single-to-differential amplifier 206, and a resistor 208. Inductor 202 includes a first terminal coupled to the input of tracking filter 201 and a second terminal coupled to ground. Capacitor 204 includes a first electrode coupled to the input of tracking filter 201 and a second electrode coupled to ground. Single-to-differential amplifier 206 includes an input coupled to the input of tracking filter 201, a first output coupled to a first terminal of resistor 208 and a second output coupled to a second terminal of resistor 208.

Tracking filter 201 further includes a second signal path including an inductor 212, a variable capacitor 214, a single-to-differential amplifier 216, and a resistor 218. Inductor 212 includes a first terminal coupled to the input of tracking filter 201 and a second terminal coupled to ground. Capacitor 214 includes a first electrode coupled to the input of tracking filter 201 and a second electrode coupled to ground. Single-to-differential amplifier 216 includes an input coupled to the input of tracking filter 201, a first output coupled to a first terminal of resistor 218 and a second output coupled to a second terminal of resistor 218.

Tracking filter 201 also includes an N-th signal path including an inductor 222, a variable capacitor 224, a single-to-differential amplifier 226, and a resistor 228. Inductor 222 includes a first terminal coupled to the input of tracking filter 201 and a second terminal coupled to ground. Capacitor 224 includes a first electrode coupled to the input of tracking filter 201 and a second electrode coupled to ground. Single-todifferential amplifier 226 includes an input coupled to the input of tracking filter 201, a first output coupled to a first terminal of resistor 228 and a second output coupled to a second terminal of resistor 228.

In an example, resistors 208, 218, and 228 are approximately ninety ohm resistors and inductors 202, 212, and 222 have widths and lengths of approximately 600 μm×600 μm. The input impedances ($R_{P1}, R_{P2}, \ldots,$ and $R_{PN}$) for each of the signals paths (1 through N) is large enough to achieve a low noise factor. For some receivers, the input impedances between 400 Ohms and 800 Ohms. For tuned inductive LC filters, the tuned impedance is given by $Rp=w_0 \ast L \ast Q$ where $w_0$ is the resonant frequency, L is the inductance. Q is the quality factor, and $R_p$ is the input impedance. For on-chip inductors, the quality factor (Q) is substantially constant for a given area and Q is proportional to the square root of the inductor area. To synthesize the desired impedance, the size of inductors 202, 212, and 222 is increased to improve Q or the inductance value is increased to avoid increased inductor area. However, large inductance values limit the maximum tuned frequency according to the following equation:

$$\omega max = \frac{1}{\sqrt{L_N \ast C_T}} \quad (1)$$

where the variable ($C_T$) represents a total parasitic capacitance. Unfortunately, this limitation increases the number of filters that are included in tracking filter 201 in order to provide the desired channel tuning.

To reduce the number of signal paths and thus the number of LC filters, tracking filter 110 of FIG. 1 extends each transfer function to cover a wider frequency band, reducing the number of signal paths and thus reducing the complexity of the circuit. An example of a tracking filter that provides three transfer functions is described below with respect to FIG. 3.

Figure 3:
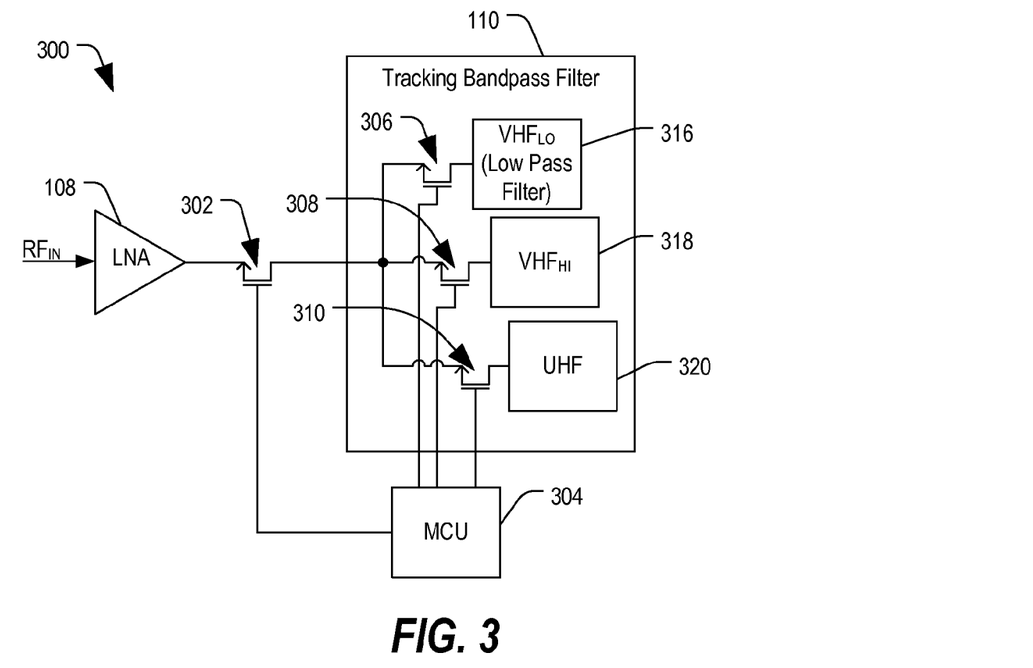
FIG. 3 is a block diagram of an embodiment of a portion of a receiver including a tracking bandpass filter having a $VHF_{LO}$ filter, a $VHF_{HI}$ filter, and a UHF filter.

FIG. 3 is a block diagram of an embodiment of a portion of a receiver 300 including a tracking filter 110 having a $VHF_{LO}$ filter 316, a $VHF_{HI}$ filter 318, and a UHF filter 320. Receiver 300 includes LNA 108 having an input for receiving a radio frequency input signal ($RF_{IN}$) and an output coupled to a source of a transistor 302. Transistor 302 includes a gate coupled to an output of an MCU 304, and a drain coupled to an input of tracking filter 110. Tracking filter 110 includes a transistor 306 having a source coupled to the input of tracking filter 110, a gate coupled to MCU 304, and a drain coupled to an input of $VHF_{LO}$ filter 316, which is implemented as a low pass filter. Tracking filter 110 further includes a transistor 308 having a source coupled to the input of tracking filter 110, a gate coupled to MCU 304, and a drain coupled to an input of $VHF_{HI}$ filter 318. Tracking filter 110 also includes a transistor 310 having a source coupled to the input of tracking filter 110, a gate coupled to MCU 304, and a drain coupled to an input of UHF filter 320.

During operation, MCU 304 selectively enables the signal path between LNA 108 and one of the filters 316, 318, and 320. In an example, MCU 304 activates transistors 302 and 306 to provide the output of LNA 108 to the input of $VHF_{LO}$ filter 316. In this instance, the $VHF_{LO}$ filter 316 is a low-pass filter that passes frequencies within the tuning range from approximately 50 MHz to approximately 190 MHz. There are no television channels below a frequency of 50 MHz, thus $VHF_{LO}$ filter 316 can be configured to low pass filter operation. Toward the higher end of the range (i.e., as the frequency approaches approximately 190 MHz, the bandwidth of the $VHF_{LO}$ filter 316 is extended by using inductive peaking to extend the tuning range. An example of the $VHF_{LO}$ filter 316 illustrating one possible circuit configuration is described below with respect to FIG. 4.

Figure 4:
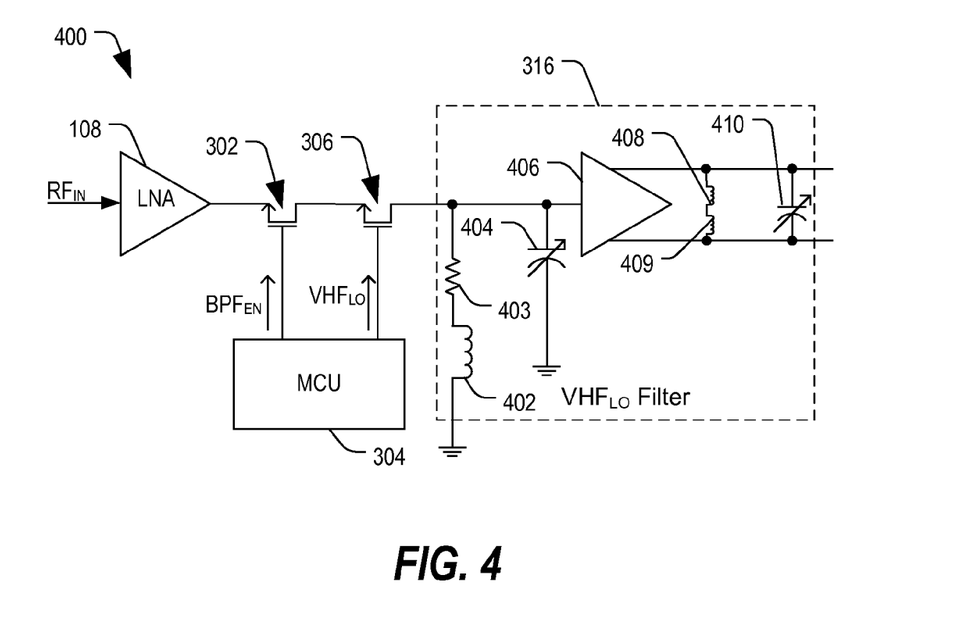
FIG. 4 is a diagram of an embodiment of the $VHF_{LO}$ filter of FIG. 3.

FIG. 4 is a diagram of an embodiment of a receiver 400, such as receiver 300 in FIG. 3, including the $VHF_{LO}$ filter 316. $VHF_{LO}$ filter 316 includes an inductor 402 and a resistor 403. Resistor 403 has a first terminal coupled to the source of transistor 306 and has a second terminal coupled to a first terminal of inductor 402, which has a second terminal coupled to ground. In this instance, resistor 403 represents the series resistance of inductor 402. $VHF_{LO}$ filter 316 further includes a variable capacitor 404 having a first electrode coupled to the drain of transistor 306 and a second electrode coupled to around. $VHF_{LO}$ filter 316 also includes a single-to-differential amplifier 406 having a first output and a second output. Inductors 408 and 409 are connected in series between the first and second outputs. Additionally, a variable capacitor 410 includes a first electrode coupled to the first output and a second electrode coupled to the second output. The first and second outputs may be coupled to a load, such as a ninety ohm resistance.

In this example, the input impedance of $VHF_{LO}$ filter 316 is mostly provided by the series resistance of the inductor 402 at low frequencies. At higher frequencies, inductor 402 extends the bandwidth through inductive peaking. The quality factor requirements are relaxed substantially making it possible to use a smaller inductor. However, the smaller inductance and correspondingly smaller input impedance sacrifices some rejection at the higher and the lower side of the frequency hand. To improve rejection. $VHF_{LO}$ filter 316 includes an inductive/capacitive (LC) bandpass filter at the outputs of the single-to-differential amplifier 406 using inductors 408 and 409 and variable capacitor 410. Instead of using a single 600 μm×600 μm inductor, $VHF_{LO}$ filter 316 includes three 150 μm×150 μm inductors, reducing the overall circuit area while extending the frequency range of $VHF_{LO}$ filter 316 relative to filters in tracking filter 201 in FIG. 2.

In the above example, $VHF_{LO}$ filter 316 from FIG. 3 uses an LC filter on the output of the single-to-differential amplifier to provide additional filtering. As the impedance level at the single-to-differential amplifier output is much smaller (about 90 Ohms), small-size, low-Q inductors can be used to implement the bandpass filter at the output of the single-to-differential amplifier. Thus, a high Q bandpass filter with a very large inductor is replaced by two lower-Q LC filters using much smaller inductors resulting in a reduced overall inductor area. The UHF filter 320 of FIG. 3 eliminates the active single-to-differential amplifier, reducing power consumption and improving the noise figure and linearity of the overall system. In place of the single-to-differential amplifier, UHF filter 320 introduces a transformer with a gain and with different Q factors between the primary and secondary inductive windings. By introducing a gain between the primary and secondary, the impact of the limited linearity of LNA 108 on overall system linearity is reduced. An example of a UI-IF filter 320 that uses a transformer instead of a single-to-differential amplifier is described below with respect to FIG. 5.

Figure 5:
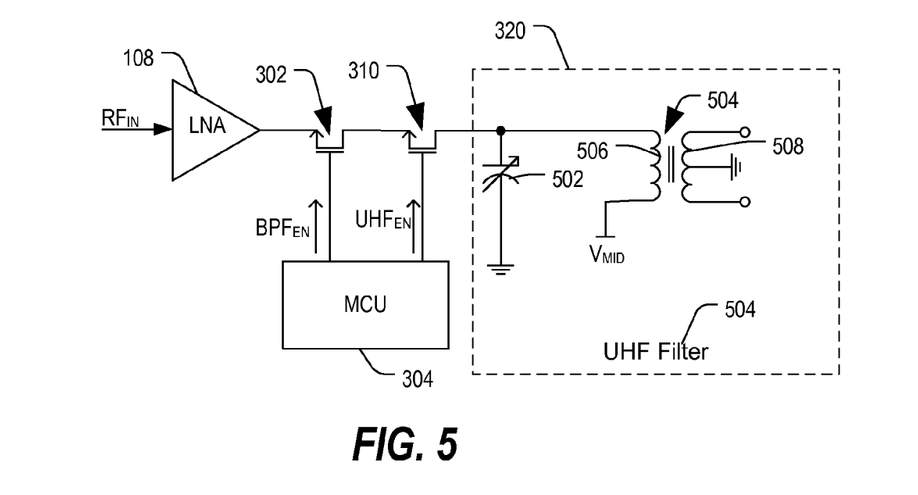
FIG. 5 is a diagram of an embodiment of the UHF filter of FIG. 3.

FIG. 5 is a diagram of an embodiment of a receiver 500 including the UHF filter 320 of FIG. 3. In this example, UHF filter 320 includes a variable capacitor 502 and an transformer 504. Variable capacitor 502 includes a first electrode coupled to the drain of transistor 310 and a second electrode coupled to ground. Transformer 504 includes a primary inductive winding 506 having a first terminal coupled to the drain of transistor 310 and a second terminal coupled to a supply voltage (such as a voltage approximately midway between the supply voltage rails). Transformer 504 further includes a secondary inductive winding 508 having, a first terminal and a second terminal, which can be coupled to mixer 112, and including a center tap coupled to ground.

In the illustrated example, the primary inductive winding 506 has a higher Q than the Q of the secondary inductive winding 508. Additionally, the transformer 504 introduces a gain from the primary inductive winding 506 to the secondary inductive winding 508. In one instance, the gain is approximately 3 dB. In an example, the secondary inductive winding 508 of transformer 504 has more turns than the primary inductive winding 506, providing the vain.

In a particular embodiment, the primary inductive winding 506 is formed from approximately 3.4 μm of high quality copper (Cu), such as Cu M8, and approximately 2.8 μm of aluminum (Al). In this embodiment, the secondary inductive winding 508 is formed from lower quality metal, such as Cu M4 or M5 and each has approximately 0.2 μm of Cu. The primary and secondary inductive windings 506 and 508 can be patterned in redistribution layers of the semiconductor substrate. The secondary inductive winding 508 is formed from lower metals to improve the sell-resonant frequency response of transformer 504. Further, the coupling coefficient is very strong (approximately k=1). A small signal model of an example of the UHF filter 320 is described below with respect to FIG. 6.

Figure 6:
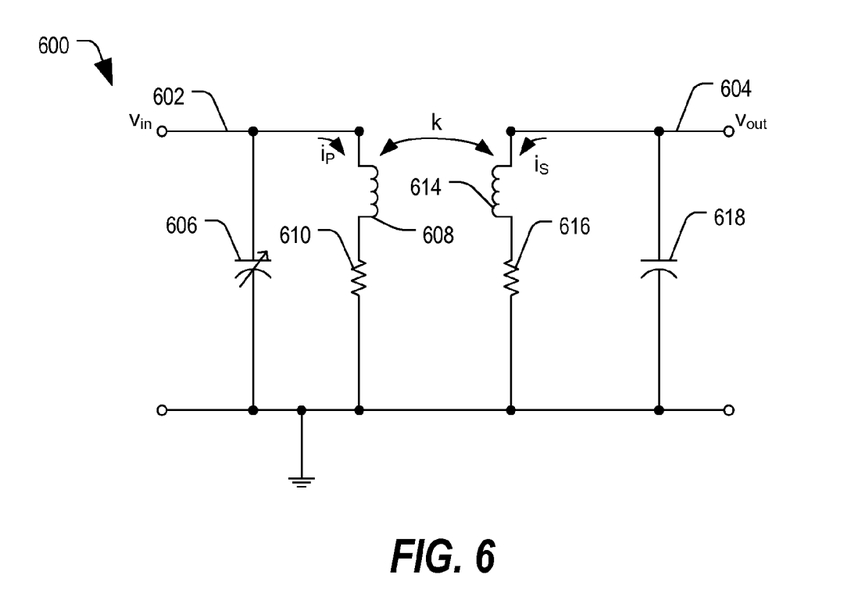
FIG. 6 is an embodiment of a small signal model of the UHF Filter of FIG. 5.

FIG. 6 is an embodiment of a small signal model 600 of the UHF Filter of FIG. 5. Small signal model 600 includes an input voltage terminal 602 for receive an input voltage ($v_{in}$) and an output voltage terminal 604 for providing an output voltage ($v_{out}$). Small signal model 600 includes variable capacitor 606 coupled between input voltage terminal 602 and ground. Variable capacitor 606 may represent variable capacitor 502 in FIG. 5 as well as a parasitic capacitance of the primary winding 506 of transformer 504 in FIG. 5. Small signal model 600 further includes an inductor 608 and a resistor 610 connected in series between input voltage terminal 602 and ground. Secondary winding 508 of transformer 504 in FIG. 5 is modeled as an inductor 614 and a resistor 616 connected in series between output voltage terminal 604 and ground. Additionally, a secondary capacitor 618 is coupled between output voltage terminal 604 and ground.

Assuming that the primary inductive winding 506 is tuned to a resonant frequency ($\omega_0$) while the secondary inductive winding 508 is not tuned, resonant frequency of the secondary winding ($\omega_s$) is much greater than the resonant frequency ($\omega_0$) as follows:

$$\omega s = \frac{1}{\sqrt{L_{614}C_{618}}} \quad (2)$$

where $L_{614}$ represents the inductance of inductor 614 and $C_{618}$ represents the capacitance of capacitor 618. The coupling between the primary and the secondary inductive windings 506 and 508 is very strong (k is approximately equal to 1). The current into the secondary winding ($i_s$) is determined according to the following equation:

$$i_s = \frac{-j\omega M i_p}{\frac{1}{j\omega C_{618}} + j\omega L_{614} + R_{616}} \quad (3)$$

$$= -j\omega M i_p \frac{1}{\frac{1 - \omega^2 L_{614} C_{618}}{j\omega C_{618}}} + R_{616}$$

wherein $R_{616}$ represents the resistance of resistor 616, the frequency ($\omega$) represents the input frequency, and the variable (M) is determined by the following equation:

$$M = k\sqrt{L_{608}L_{614}} \quad (4)$$

Since k=1, for frequencies around the resonant frequency ($\omega_0$), the current into the secondary winding 508 can be determined according to the following equation:

$$i_s = i_p \frac{\omega^2 M C_{614}}{1 + j\omega R_{616} C_{618}} \quad (5)$$

where $i_s$ is the current flowing in the secondary inductive winding 508 and $i_p$ is the current flowing in the primary inductive winding 506.

In the illustrated example, the input voltage ($v_{in}$) is determined by the following equation:

$$v_{in} = (jwL_{608} + R_{610})i_p + j\omega M \frac{\omega^2 M C_{618}}{1 + j\omega R_{616} C_{618}} i_p \quad (6)$$

and the effective impedance ($Z_{eff}$) looking into the primary winding of the transformer is determined as follows:

$$Z_{eff} = \frac{v_{in}}{i_p} \quad (7)$$

$$= j\omega L_{608} + R_{610} + \omega^2 M^2 \frac{j\omega C_{618}}{1 + j\omega R_{616} C_{618}}$$

In the equation 7, the factor $j\omega L_{608}+R_{610}$ is the impedance due to the primary inductive winding 506, and the remainder of the equation is the impedance due to the secondary inductive winding 508. Assuming that the factor $\omega R_{616}C_{616}$ is much smaller than 1, the effective impedance ($Z_{eff}$) simplifies as follows:

$$Z_{eff} = j\omega L_{608} + R_{610} + \omega^2 M^2 j\omega C_{618}(1-j\omega R_{616}C_{618}) = j\omega(L_{608}+\omega^2 M^2 C_{618}) + R_{610}+\omega^4 M^2 C_{618}^2 R_{616}^2 \quad (8)$$

The effective impedance due to the inductance ($L_{eff}$) is determined according to the following equation:

$$L_{eff} = L_{608} + \omega^2 M^2 C_{618} \quad (9)$$

$$= L_{608}(1 + \omega^2 L_{614} C_{618})$$

$$= L_{608}\left(1 + \frac{\omega^2}{\omega_s^2}\right)$$

The effective impedance due to the resistance ($R_{eff}$) is determined according to the following equation:

$$R_{eff} = R_{610} + \omega^4 M^2 C_{618}^2 R_{616} \quad (10)$$

-continued $$= R_{610} + \left(\frac{\omega}{\omega_s}\right)^4 \frac{L_{608}}{L_{614}} R_{616}$$

In the above examples, if the ratio of the resonant frequency ($\omega_0$) to the frequency ($\omega_s$) is kept small, the secondary inductive winding 508 has limited effect on the tuned frequency of primary inductive winding 506. Additionally, by keeping this ratio small, the effect of the secondary inductive winding on the quality factor (Q) is also kept small. For example, if the ratio is approximately $\frac{1}{3}^{rd}$, and the resistance ($R_{616}$) is approximately 10 times the resistance of resistor 610, and if the inductances of inductors 608 and 614 are approximately equal, then the effective quality factor ($Q_{eff}$) can be determined by the following equation:

$$Qeff \cong 0.99 \frac{\omega L_{608}}{R_{610}} \quad (11)$$

Further, on the secondary side, the output voltage ($v_{out}$) relates to the input voltage ($v_{in}$) according to the following equation:

$$v_{out} = v_{in} \sqrt{\frac{L_{614}}{L_{608}}} \quad (12)$$

Equation 12 demonstrates a conversion gain in transformer 504. At higher frequencies, it can be demonstrated that the secondary inductive winding 508 acts as a second order inductive/capacitive (LC) low-pass filter on top of the LC bandpass characteristics of the primary inductive winding 506.

Thus, the single-ended to differential conversion provided by a single-to-differential amplifier in the prior art can be replaced by performing the conversion magnetically with a transformer 504 having a secondary inductive winding 508 with a low quality factor. The effect of the secondary inductive winding 508 on the quality factor of the primary inductive winding 506 is proportional to the fourth power of the frequency. Accordingly, the quality factor and hence the gain of the LNA 108 decreases with increased tuned frequency, which helps to reduce the gain variation in the transfer function of the UHF filter 320. Further, as discussed, it is possible to implement a conversion gain of more than 0 dB by adjusting a number of turns on the secondary inductive winding 508 to provide the gain. By introducing such a gain, the transformer 504 operates to reduce the signal level at the output of LNA 108, improving the in-band third-order intercept point (HP3) of the LNA 108 by providing the gain in the transformer 504.

In conjunction with the circuits described above with respect to FIGS. 1-6, a receiver is disclosed that includes a tracking filter having a reduced number of LC filters relative to conventional tracking filters for television reception. In particular, the tracking filter divides the frequency range into three bands ($VHF_{LO}$, $VHF_{HI}$, and UHF), and provides a low-pass filter for the $VHF_{LO}$ frequencies, a bandpass filter for the $VHF_{HI}$ frequencies, and a transformer-based bandpass filter for UHF broadcast signals.

Although the present invention has been described with reference to preferred embodiments, workers skilled in the art will recognize that changes may be made in form and detail without departing from the spirit and scope of the invention.

What is claimed is:

1. A receiver comprising:
    a low noise amplifier including an input for receiving a radio frequency signal and including an output; and
    a tracking filter having an input coupled to the output of the low noise amplifier, the tracking filter including a bandpass filter configured to pass the radio frequency signals, the bandpass filter comprising:
        a variable capacitor including a first electrode coupled to the input of the tracking filter for receiving the radio frequency signals, and a second electrode coupled to a power supply terminal; and
        a transformer including a primary winding having a first terminal coupled to the first electrode of the variable capacitor and a second terminal coupled to a second power supply terminal, the transformer further including a secondary winding for providing an output of the tracking filter, wherein the secondary winding has an larger number of turns than the primary winding.

2. The receiver of claim 1, wherein the tracking filter further includes a second filter to pass frequencies of the radio frequency signal that are below a second threshold, the second filter comprising:
    an inductor including a first terminal coupled to the input of the tracking filter, and a second terminal coupled to the power supply terminal;
    a second variable capacitor including a first electrode coupled to the input of the tracking filter, and including a second electrode coupled to the power supply terminal;
    a single-to-differential amplifier including an input coupled to the first electrode of the second variable capacitor, a first output, and a second output; and
    a low-pass filter coupled between the first and second outputs.

3. The receiver of claim 2, wherein the low-pass filter comprises:
    a second inductor including a first terminal coupled to the first output, and a second terminal;
    a third inductor including a first terminal coupled to the second terminal of the second inductor, and a second terminal coupled to the second output; and
    a third variable capacitor including a first electrode coupled to the first output and a second electrode coupled to the second output.

4. The receiver of claim 1, wherein a quality factor of the primary winding is greater than a quality factor of the secondary winding.

5. The receiver of claim 1, wherein:
    the primary winding is formed from copper and aluminum; and
    the secondary winding is formed from copper.

6. The receiver of claim 1, wherein the secondary winding is formed from a thinner metal than the primary winding.

7. The receiver of claim 1, wherein, when the secondary winding acts as a second-order inductive-capacitive low-pass filter.

8. A receiver comprising:
    a low noise amplifier including an input for receiving a radio frequency signal and including an output; and
    a tracking filter coupled to the output of the low noise amplifier and including a first filter configured to pass the radio frequency signals below a first frequency threshold, the first filter comprising:

a single-to-differential amplifier including an input coupled to the output of the low noise amplifier through a lowpass filter, and including a first output and a second output; and a tracking bandpass filter coupled between the first and second outputs.

9. The receiver of claim 8, wherein the lowpass filter comprises:

an inductor including a first terminal coupled to the output of the low noise amplifier and a second terminal coupled to a power supply terminal; and a variable capacitor including a first electrode coupled to the output of the low noise amplifier and a second electrode coupled to the power supply terminal.

10. The receiver of claim 8, wherein the tracking bandpass filter comprises:

a first inductor including a first terminal coupled to the first output, and a second terminal;

a second inductor including a first terminal coupled to the second terminal of the second inductor, and a second terminal coupled to the second output; and a variable capacitor including a first electrode coupled to the first output and a second electrode coupled to the second output.

11. The receiver of claim 8, wherein the tracking filter includes a second filter comprising:

a variable capacitor including a first electrode coupled to the output of the low noise amplifier, and a second electrode coupled to a power supply terminal; and a transformer including a primary winding having a first terminal coupled to the first electrode of the variable capacitor and a second terminal coupled to a second power supply terminal, the transformer further including a secondary winding having a first terminal and a second terminal.

12. The receiver of claim 11, wherein the second power supply terminal provides a mid-range voltage between power supply rails.

13. The receiver of claim 11, wherein the secondary winding includes more turns than the primary winding.

14. A tracking filter for use in a television receiver, the tracking filter comprising:

an input terminal for receiving a radio frequency signal;

a first filter including an input coupled to the input terminal and configured to pass frequencies below a first threshold, the first filter comprising:

a lowpass filter coupled to the input terminal;

a single-to-differential amplifier including an input coupled to the input terminal, and including a first output and a second output;

a band-pass filter coupled between the first and second outputs; and a second filter including an input coupled to the input terminal and configured to pass frequencies between the first threshold and a second threshold.

15. The tracking filter of claim 14, wherein the lowpass filter comprises:

an inductor having a first terminal coupled to the input terminal, and a second terminal coupled to a power supply terminal; and a variable capacitor including a first electrode coupled to the input terminal, and a second electrode coupled to the power supply terminal.

16. The tracking filter of claim 14, further comprising a third filter including:

variable capacitor including a first electrode coupled to the input terminal, and a second electrode coupled to a first power supply terminal; and a transformer including a primary winding having a first terminal coupled to the first electrode of the variable capacitor and a second terminal coupled to a second power supply terminal, the transformer further including a secondary winding having a first terminal and a second terminal.

17. The tracking filter of claim 16, wherein the secondary winding includes more turns than the primary winding.

18. The tracking filter of claim 16, wherein the primary winding has a first quality factor that is higher than a second quality factor of the secondary winding.

19. The tracking filter of claim 18, wherein the secondary winding has an effect on the first quality factor that is inversely proportional to a fourth power of a tuned frequency.

* * * * *

UNITED STATES PATENT AND TRADEMARK OFFICE
CERTIFICATE OF CORRECTION

PATENT NO. : 8,725,103 B2
APPLICATION NO. : 13/342548
DATED : May 13, 2014
INVENTOR(S) : Mustafa H. Koroglu et al.

Page 1 of 2

It is certified that error appears in the above-identified patent and that said Letters Patent is hereby corrected as shown below:

In the Specification

Column 1, line 25, replace "(WV)," with "(UHF),".

Column 1, line 26, replace "hands." with "bands.".

Column 1, line 45, replace "having," with "having".

Column 2, line 13, replace "tiller" with "filter".

Column 2, line 45, replace "herein." with "herein,".

Column 2, line 47, replace "MHz." with "MHz,".

Column 3, line 51, replace "interlace" with "interface".

Column 3, line 52, replace "or" with "of".

Column 5, line 13, replace "inductance." with "inductance,".

Column 6, line 14, replace "around." with "ground.".

Column 6, line 30, replace "hand." with "band.".

Column 6, line 30, replace "rejection." with "rejection,".

Column 6, line 55, replace "UI-IF" with "UHF".

Column 7, line 1, replace "having," with "having".

Signed and Sealed this
Seventh Day of October, 2014

Michelle K. Lee
*Deputy Director of the United States Patent and Trademark Office*

CERTIFICATE OF CORRECTION (continued)
U.S. Pat. No. 8,725,103 B2

Column 7, line 11, replace "vain." with "gain.".

Column 7, line 21, replace "sell-resonant" with "self-resonant".

Column 8, line 4 of the paragraph that begins after equation 7, replace "$C_{616}$" with "$C_{618}$".

Column 9, line 55, replace "(HP3)" with "(IIP3)".